(12) United States Patent
Liu et al.

(10) Patent No.: US 11,657,641 B2
(45) Date of Patent: May 23, 2023

(54) BIOMETRIC SENSING DEVICE AND DISPLAY APPARATUS INCLUDING SAME

(71) Applicant: Innolux Corporation, Miao-Li County (TW)

(72) Inventors: Yu-Tsung Liu, Miao-Li County (TW); Te-Yu Lee, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/573,622

(22) Filed: Jan. 11, 2022

(65) Prior Publication Data

US 2022/0262157 A1  Aug. 18, 2022

(30) Foreign Application Priority Data

Feb. 18, 2021 (CN) .......................... 202110187545.8

(51) Int. Cl.
*G06V 40/13* (2022.01)
*H01L 27/146* (2006.01)

(52) U.S. Cl.
CPC .... *G06V 40/1318* (2022.01); *H01L 27/14678* (2013.01)

(58) Field of Classification Search
None
See application file for complete search history.

(56) References Cited

U.S. PATENT DOCUMENTS

| | | | |
|---|---|---|---|
| 2008/0302949 A1* | 12/2008 | Kim | H04N 5/3597 250/206 |
| 2019/0259801 A1* | 8/2019 | Seto | H01L 27/14603 |
| 2022/0027598 A1* | 1/2022 | Lee | G06V 40/1365 |

FOREIGN PATENT DOCUMENTS

| | | |
|---|---|---|
| CN | 109686808 | 4/2019 |
| CN | 111539340 | 8/2020 |

* cited by examiner

*Primary Examiner* — Joseph R Haley
(74) *Attorney, Agent, or Firm* — JCIPRNET (57) ABSTRACT

A biometric sensing device and a display apparatus including the same are provided. The biometric sensing device includes a first thin film transistor, a second thin film transistor, and a photodiode. The first thin film transistor has a gate. The second thin film transistor has a semiconductor layer and a non-gate electrode terminal. The non-gate electrode terminal is electrically connected to the gate of the first thin film transistor. The photodiode contacts a semiconductor layer.

16 Claims, 5 Drawing Sheets

BIOMETRIC SENSING DEVICE AND DISPLAY APPARATUS INCLUDING SAME

CROSS-REFERENCE TO RELATED APPLICATION

This application claims the priority benefit of China application serial no. 202110187545.8, filed on Feb. 18, 2021. The entirety of the above-mentioned patent application is hereby incorporated by reference herein and made a part of this specification.

BACKGROUND

Technical Field

The embodiments of the disclosure relate to an electronic apparatus, and in particular, relates to a biometric sensing device and a display apparatus including the same.

Description of Related Art

As the applications of electronic apparatuses continue to rise, the development of display technology is changing with each passing day as well. Regarding the applications of electronic apparatuses and the habits or needs of users, as the requirements for the structure and quality of the electronic apparatuses grow higher, and the electronic apparatuses are faced with different problems. For instance, the sensitivity of the sensing element in the electronic apparatus is affected by the equivalent capacitance in the circuit. Therefore, the research and development of electronic apparatuses are required to be continuously updated and adjusted.

SUMMARY

The disclosure is directed at a biometric sensing device and a display apparatus including the same capable of providing improved photoelectric conversion efficiency and exhibiting good sensitivity or electrical quality.

According to an embodiment of the disclosure, a biometric sensing device includes a first thin film transistor, a second thin film transistor, and a photodiode. The first thin film transistor has a gate. The second thin film transistor has a semiconductor layer and a non-gate electrode terminal. The non-gate electrode terminal is electrically connected to the gate of the first thin film transistor. The photodiode contacts a semiconductor layer.

According to an embodiment of the disclosure, a display apparatus includes a display panel and the biometric sensing device. The biometric sensing device is disposed below the display panel.

To sum up, in the biometric sensing device and the display apparatus including the same provided by an embodiment of the disclosure, since the sensing circuit may control the second thin film transistor through the driving signal, during the sensed value readout period, the second thin film transistor is turned on, and that the charge stored in the photodiode is selectively transferred onto the floating diffusion node due to the charge transfer effect. Therefore, the charge on the floating diffusion node is essentially the charge transferred from the photodiode. The equivalent capacitance on the floating diffusion node may be reduced. Therefore, the photoelectric conversion efficiency of the biometric sensing device and the sensing circuit thereof may be improved. The biometric sensing device may exhibit good sensitivity or electrical quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The accompanying drawings are included together with the detailed description provided below to provide a further understanding of the disclosure. Note that in order to make the accompanying drawings to be more comprehensible to readers and for the sake of clarity of the accompanying drawings, only part of the electronic apparatus is depicted in the accompanying drawings of the disclosure, and specific elements in the drawings are not depicted according to actual scales. In addition, the numbers and sizes of the elements in each drawing are provided for illustration only and are not used to limit the scope of the disclosure.

Throughout the specification and appended claims of the disclosure, certain terms are used to refer to specific components. A person having ordinary skill in the art should understand that electronic apparatus manufacturers may refer to the same elements by different names. In the specification, it is not intended to distinguish between elements that have the same function but different names. In the following specification and claims, the words "including", "containing", and "having" are open-ended words and therefore should be interpreted as "containing but not limited to … ". Therefore, when the term "including", "containing", and "having" are used in the description of the disclosure, it specifies the existence of corresponding features, regions, steps, operations, and/or components, but does not exclude the existence of one or more corresponding features, regions, steps, operations, and/or components.

In the following embodiments, wording used to indicate directions, such as "up", "down", "front", "back", "left", and "right" merely refers to directions in the accompanying figures. Therefore, the directional wording is used to illustrate rather than limit the disclosure. In the accompanying drawings, common characteristics of the methods, structures, and/or materials used in specific embodiments are shown. However, the accompanying drawings should not be interpreted to define or limit the scopes or the properties of the descriptions in the embodiments. For instance, the relative size, thickness, and location of each film layer, region, and/or structure may be reduced or enlarged for clarity.

In the disclosure, the length and width may be measured by an optical microscope, and the thickness may be measured from a cross-sectional image in an electron microscope, but it is not limited thereto.

The terms "about", "equal to", "identical" or "same", "substantially", or "approximately" are generally interpreted as being within 20% of a given value or are interpreted as being within 10%, 5%, 3%, 2%, 1%, or 0.5% of a given value.

In the disclosure, if one structure (or layer, component, substrate) is described as being located on another structure (or layer, element, substrate), it can mean that the two structures are adjacent and are directly connected, or the two structures are adjacent to each other instead of being directly connected. Indirect connection means that at least one intermediary structure (intermediary layer, intermediary component, intermediary substrate, or intermediary interval) is provided between two structures, the lower side surface of one structure is adjacent to or is directly connected to the upper side surface of the intermediate structure, and the upper side surface of the other structure is adjacent to or is directly connected to the lower side surface of the intermediate structure. The intermediary structure may be formed by a single-layer or multi-layer physical structure or a non-physical structure, which is not particularly limited. In the disclosure, when a specific structure is disposed to be "on" another structure, it may mean that the specific structure is "directly" on another structure, or it may mean that the specific structure is "indirectly" on another structure. That is, at least one structure is provided between the specific structure and the another structure.

The terms "first", "second, etc. provided in the specification of the disclosure may be used to describe various elements, components, regions, layers, and/or portions in the specification, but these elements, components, regions, layers, and/or portions should not be limited by these terms. These terms are used to distinguish one element, component, region, layer, or portion from another element, component, region, layer, or portion. Therefore, the "first element", "component", "region", "layer", or "portion" discussed below may be referred to as being distinguished from the "second element", "component", "region", "layer", or "portion", but are not used to limit the sequence or specific elements, components, regions, layers, and/or portions. Further, the "first" element referred to in the paragraphs of the specification may be renamed the "second" element in the claims.

The electronic apparatus may have a display function, and the electronic apparatus provided by the embodiments of the disclosure may include a display apparatus, an antenna apparatus, a sensing apparatus, a splicing apparatus, or a transparent display apparatus, but is not limited thereto. The electronic apparatus may be a rollable, stretchable, bendable, or flexible electronic apparatus. The electronic apparatus may include, for example, liquid crystal, a light emitting diode (LED), a quantum dot (QD), fluorescence, phosphor, other suitable materials which may be arbitrarily arranged and combined, other suitable display media, or a combination of the foregoing. The light emitting diode may include, but not limited to, an organic LED (OLED), a millimeter/sub-millimeter LED (mini LED), a micro LED, or a QD LED (e.g., QLED and QDLED). The antenna apparatus may be, for example, a liquid crystal antenna, but is not limited thereto. The splicing apparatus may be, for example, a display splicing apparatus or an antenna splicing apparatus, but is not limited thereto. Note that the electronic apparatus may be any combination of the foregoing, but is not limited thereto. Besides, the appearance of the electronic apparatus may be rectangular, circular, polygonal, or a shape with curved edges, or other suitable shapes. The electronic apparatus may have a peripheral system such as a driving system, a control system, a light source system, a shelf system, etc., to support the display apparatus, the antenna apparatus, or the splicing apparatus. Hereinafter, a biometric sensing device and a display apparatus including the same are used to describe the content of the disclosure, but the disclosure is not limited thereto.

In the disclosure, the various embodiments described below may be mixed and combined without departing from the spirit and scope of the disclosure. For instance, part of the features of one embodiment may be combined with part of the features of another embodiment to form another embodiment.

Descriptions of the disclosure are given with reference to the exemplary embodiments illustrated by the accompanying drawings. Wherever possible, the same reference numbers are used in the drawings and the description to refer to the same or like parts.

Figure 1:
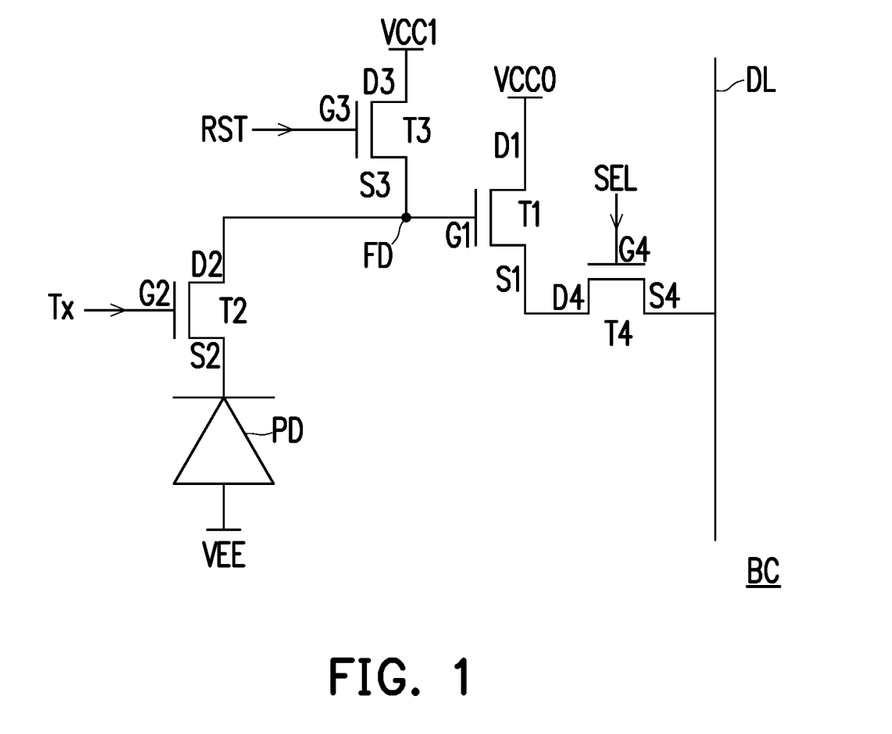
FIG. 1 is a schematic diagram of a sensing circuit of a biometric sensing device according to an embodiment of the disclosure.
Figure 2:
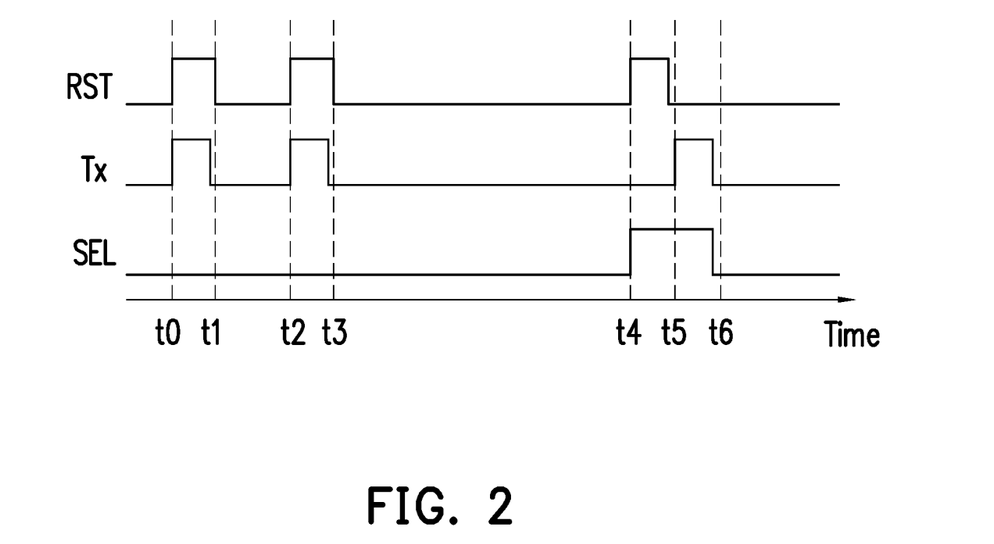
FIG. 2 is a signal timing diagram of the sensing circuit according to an embodiment of the disclosure.
Figure 3:
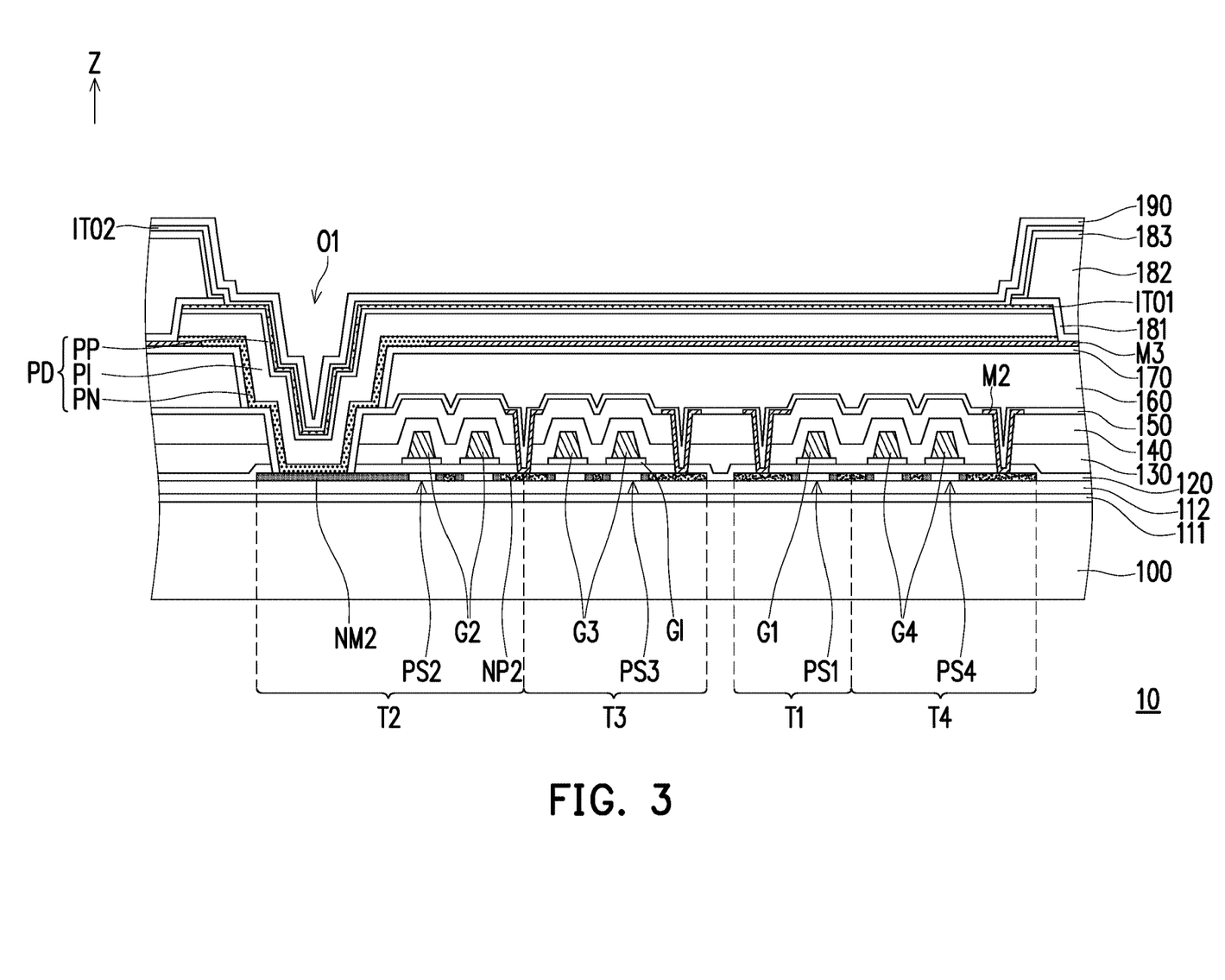
FIG. 3 is a schematic cross-sectional view of the biometric sensing device according to an embodiment of the disclosure.

FIG. 1 is a schematic diagram of a sensing circuit of a biometric sensing device according to an embodiment of the disclosure. FIG. 2 is a signal timing diagram of the sensing circuit according to an embodiment of the disclosure. FIG. 3 is a schematic cross-sectional view of the biometric sensing device according to an embodiment of the disclosure. For clarity of the accompanying drawings and convenience of description, several elements are omitted in FIG. 3. With reference to FIG. 1, FIG. 2, and FIG. 3, in an embodiment of the disclosure, a biometric sensing device 10 is, but not limited to, a fingerprint sensing device. In other embodiments, the biometric sensing device 10 includes a face sensing device, a palm print sensing device, an iris sensing device, a retina sensing device, or other suitable biometric sensing devices. The biometric sensing device 10 is, for example, a sensing circuit. The biometric sensing device 10 includes a first thin film transistor T1, a second thin film transistor T2, and a photodiode PD. The first thin film transistor T1 has a gate G1. The second thin film transistor T2 has a semiconductor layer PS2 and a non-gate G2 electrode terminal (e.g., a second terminal D2 shown in FIG. 1, which may be a source or a drain). The non-gate G2 electrode terminal is electrically connected to the gate G1 of the first thin film transistor T1. The second thin film transistor T2 and the first thin film transistor T1 are connected at a floating diffusion node FD. At least one portion of the semiconductor layer PS2 may extend. The photodiode PD contacts, but not limited to, the at least one portion of the semiconductor layer PS2. In some embodiments, the biometric sensing device 10 further includes a third thin film transistor T3 and a fourth thin film transistor T4. The third thin film transistor T3 is electrically connected to the gate G1 of the first thin film transistor T1. The fourth thin film transistor T4 is electrically connected to the non-gate G1 electrode terminal (e.g., a first terminal S1 shown in FIG. 1, which may be a source or a drain) of the first thin film transistor T1. Under the above configuration, after the third thin film transistor T3 is reset, a stored charge of the photodiode PD may be transferred to the floating diffusion node FD through the second thin film transistor T2. In this way, the equivalent capacitance at the floating diffusion node FD may be reduced. The photoelectric conversion efficiency may thereby be improved, and that the biometric sensing device 10 may exhibit good sensitivity or electrical quality.

With reference to FIG. 1 and FIG. 3 again, the biometric sensing device 10 includes a substrate 100 and a sensing circuit BC disposed on the substrate 100. The sensing circuit BC includes a plurality of thin film transistors (TFTs), a data line DL, and the photodiode PD. The thin film transistors include, for example, the first thin film transistor T1, the second thin film transistor T2, the third thin film transistor T3, and the fourth thin film transistor T4. Each thin film transistor includes a gate and a non-gate electrode terminal (e.g., a first terminal or a second terminal). In this embodiment, the gate G1 of the first thin film transistor T1 and the non-gate electrode terminal of the second thin film transistor T2 are electrically connected to the floating diffusion node FD. To be specific, the non-gate electrode terminal of the second thin film transistor T2 includes a first terminal S2 (e.g., a source of the second thin film transistor T2) and a second terminal D2 (e.g., a drain of the second thin film transistor T2). The first terminal S2 is electrically connected to the photodiode PD. The second terminal D2 is electrically connected to the gate G1 of the first thin film transistor T1 at the floating diffusion node FD. A second terminal D1 of the first thin film transistor T1 is coupled to a first voltage source VCC0. Under the above configuration, the first thin film transistor T1 may be a source follower and has a signal amplification application. In addition, the gate G2 of the second thin film transistor T2 may receive a signal Tx (e.g., a driving signal) to determine turning on/off of the second thin film transistor T2.

One terminal of the photodiode PD may be electrically connected to the first terminal S2 of the second thin film transistor T2. Another terminal of the photodiode PD is coupled to a third voltage source VEE. When the photodiode PD is irradiated by light radiation, a current or charge may be generated and stored in the photodiode PD. The above light radiation includes, for example, visible light, ultraviolet light (UV light), infrared light, X-ray, microwave or other suitable radiation types. Under the above configuration, the signal Tx may control the second thin film transistor T2 to determine whether to transfer the charge in the photodiode PD onto the floating diffusion node FD and the gate G1 of the first thin film transistor T1.

The non-gate electrode terminal of the third thin film transistor T3 is electrically connected to the gate G1 of the first thin film transistor T1. For instance, a first terminal S3 of the third thin film transistor T3 (e.g., a source or drain of the third thin film transistor T3) is electrically connected to the gate G1 of the first thin film transistor T1 at the floating diffusion node FD. A second terminal D3 of the third thin film transistor T3 (e.g., the source or drain of the third thin film transistor T3) is coupled to a second voltage source VCC1. In some embodiments, a gate G3 of the third thin film transistor T3 may receive a signal RST to determine turning on/off of the third thin film transistor T3. In some embodiments, a voltage of the third voltage source VEE may be less than, but not limited to, a voltage of the first voltage source VCC0 or a voltage of the second voltage source VCC1.

In some embodiments, the second voltage source VCC1 may be a reset voltage. The signal RST may be a reset signal. That is, the third thin film transistor T3 may be a reset thin film transistor (reset TFT). Under the above configuration, the signal RST may control the third thin film transistor T3 to be configured for resetting the floating diffusion node FD and a voltage of the gate G1 of the first thin film transistor T1. Besides, a voltage at the floating diffusion node FD may be used for controlling turning on/off of the first thin film transistor T1.

The non-gate electrode terminal of the fourth thin film transistor T4 is electrically connected to the non-gate electrode terminal of the first thin film transistor T1. For instance, a second terminal D4 of the fourth thin film transistor T4 (e.g., a source or drain of the fourth thin film transistor T4) is electrically connected to the first terminal S1 of the first thin film transistor T1. A first terminal S4 of the fourth thin film transistor T4 (e.g., the source or drain of the fourth thin film transistor T4) is coupled to the data line DL. In some embodiments, a gate G4 of the fourth thin film transistor T4 may receive a signal SEL to determine turning on/off of the fourth thin film transistor T4.

In some embodiments, the signal SEL may be a selector signal. That is, the fourth thin film transistor T4 may be a selector thin film transistor (selector TFT). Under the above configuration, the signal SEL may control the fourth thin film transistor T4, so that during a reading period, a signal passing through the first voltage source VCC0 of the first thin film transistor T1 may pass through the fourth thin film transistor T4 to be transmitted to the data line DL to be read in a subsequent step.

In some embodiments, the data line DL may be selectively coupled to a signal reading element (not shown) to read, but not limited to, the signal transmitted from the first terminal S4 of the fourth thin film transistor T4 to the data line DL. In this embodiment, the sensing circuit BC may be a 4T active pixel sensor (APS) including but not limited to four thin film transistors (TFTs).

In the embodiments of the disclosure, the thin film transistors (e.g., the first thin film transistor T1, the second thin film transistor T2, the third thin film transistor T3, and the fourth thin film transistor T4) may include semiconductor layers (e.g., a semiconductor layer PS1, a semiconductor layer PS2, a semiconductor layer PS3, and a semiconductor layer PS4 shown in FIG. 3). Materials of the semiconductor layers include but not limited to amorphous silicon, low temperature poly-silicon (LIPS), metal oxide, or other suitable materials, for example. The thin film transistors may include but not limited to top gate, bottom gate, or dual gate or double gate thin film transistors, or a combination of the foregoing materials. In some embodiments, the thin film transistors may have the different semiconductor materials described above. In the disclosure, the first terminal and the second terminal of each of the thin film transistors (e.g., the first thin film transistor T1, the second thin film transistor T2, the third thin film transistor T3, and the fourth thin film transistor T4) may respectively be the source and the drain, but the disclosure is not limited thereto. In addition, the gate of each of the thin film transistors may be treated as a control terminal of the thin film transistor. Further, in the disclosure, the gate of each of the thin film transistors may include but not limited to polysilicon, metal, or other conductive materials. The abovementioned metal includes but not limited to copper (Cu), aluminum (Al), molybdenum (Mo), tungsten (W), gold (Au), chromium (Cr), nickel (Ni), platinum (Pt), or titanium (Ti). In the disclosure, materials of the source and drain of each of the thin film transistors may include but not limited to copper (Cu), aluminum (Al), molybdenum (Mo), tungsten (W), gold (Au), chromium (Cr), nickel (Ni), platinum (Pt), or titanium (Ti), for example.

The following briefly describes the way of controlling the sensing circuit BC with reference to FIG. 1 and FIG. 2.

In some embodiments, the sensing circuit BC may be divided into a plurality of periods in one frame according to user's design, including a pre-reset period, a reset period, an exposure period, a reference value readout period, and a sensed value readout period. In some embodiments, each frame may be defined as a period between time t0 and time t6. In some embodiments, each frame may be, but not limited to, longer than 50 milliseconds (ms).

To be specific, first, before time to, the reset signal RST, the driving signal Tx, and the selector signal SEL are at low voltage levels.

Next, during the pre-reset period from time t0 to time t1, the reset signal RST and the driving signal Tx are switched to high voltage levels. Therefore, the gates G3 and G2 of the third thin film transistor T3 and the second thin film transistor T2 respectively receive the reset signal RST and the driving signal Tx. The third thin film transistor T3 and the second thin film transistor T2 are on (that is, they are turned on). The selector signal SEL still maintains a low voltage level, that is, the fourth thin film transistor T4 is off (that is, it is turned off). Besides, the driving signal Tx may be switched to a low voltage level before time t1, and the reset signal RST may be switched to a low voltage level at time t1. In other words, the second thin film transistor T2 may be turned off before the third thin film transistor T3.

During the pre-reset period, the voltage of the floating diffusion node FD connected to the gate G1 of the first thin film transistor T1, the first terminal S2 of the second thin film transistor T2, and the first terminal S3 of the third thin film transistor T3 may be reset according to the voltage of the second voltage source VCC1.

Next, during the reset period from time t2 to time t3, the reset signal RST and the driving signal Tx are switched to high voltage levels. The selector signal SEL still maintains a low voltage level. The driving signal Tx may be switched to a low voltage level before time t3, and the reset signal RST may be switched to a low voltage level at time t3. In other words, the second thin film transistor T2 may be turned off before the third thin film transistor T3. Similar to the pre-reset period, during the reset period, the voltage of the floating diffusion node FD and the voltage of the first terminal S2 of the second thin film transistor T2 may be reset, so description thereof is not repeated herein.

In some embodiments, the pre-reset period and the reset period may also be combined into one reset period, but are not limited thereto. In some other embodiments, only one of the pre-reset period or the reset period may be performed, but the disclosure is not limited thereto.

Next, during the exposure period from time t3 to time t4, the reset signal RST, the driving signal Tx, and the selector signal SEL are at low voltage levels. During the exposure period, light radiation irradiates the photodiode PD of the sensing circuit BC to generate a current and to store a charge in the photodiode PD.

Next, during the reference value reading period from time t4 to time t5, at time t4, the reset signal RST and the selector signal SEL are switched to high voltage levels. The driving signal Tx is at a low voltage level. Therefore, the gates G3 and G4 of the third thin film transistor T3 and the fourth thin film transistor T4 respectively receive the reset signal RST and the selector signal SEL. The third thin film transistor T3 and the fourth thin film transistor T4 are on. Before time t5, the reset signal RST is switched to a low voltage level, so that the third thin film transistor T3 is off. During the reference value readout period, the voltage of the floating diffusion node FD is, for example, a background value before exposure, and may be outputted to the data line DL through the first thin film transistor T1 and the fourth thin film transistor T4. The signal reading element coupled to the data line DL may set the read background value as a first signal.

Next, during the sensed value readout period from time t5 to time t6, at time t5, the driving signal Tx is switched to a high voltage level. The selector signal SEL is at a high voltage level from time t4 to time t6. Besides, the reset signal RST is at a low voltage level. Therefore, the gates G2 and G4 of the second thin film transistor T2 and the fourth thin film transistor T4 respectively receive the driving signal Tx and the selector signal SEL. The second thin film transistor T2 and the fourth thin film transistor T4 are on. Before time t5, the driving signal Tx is switched to a low voltage level, so that the second thin film transistor T2 is off.

When the driving signal Tx controls the second thin film transistor T2 to be on, the charge stored in the photodiode PD is selectively transferred onto the floating diffusion node FD for controlling the turning on-off of the first thin film transistor T1. During the sensed value readout period, the voltage of the floating diffusion node FD is, for example, a sensed voltage of the photodiode PD after exposure, and may be outputted to the data line DL through the first thin film transistor T1 and the fourth thin film transistor T4. The signal reading element coupled to the data line DL may set a read sensed value as a second signal.

Next, the signal reading element may compare the first signal (background value) with the second signal (sensed value) to obtain optical information.

Note that the sensitivity of the sensing circuit BC may be defined by the following formula 1:

$$QE \times CG = \text{sensitivity} \quad \text{(formula 1)},$$

where QE is the quantum efficiency of the photodiode PD, and CG is the photoelectric conversion efficiency. The photoelectric conversion efficiency may be defined by the following formula 2:

$$\frac{q}{C_{FD}} = CG, \quad \text{(formula 2)}$$

where q is the charge of the photodiode PD, and $C_{FD}$ is the equivalent capacitance on the floating diffusion node FD. The quantum efficiency QE is a fixed value depending on the material. Therefore, when the equivalent capacitance $C_{FD}$ on the floating diffusion node FD decreases, the photoelectric conversion efficiency CG improves. When the photoelectric conversion efficiency CG improves, the sensitivity of the sensing circuit BC is enhanced.

When the driving signal Tx controls the second thin film transistor T2 to be on, the charge stored in the photodiode PD is selectively transferred onto the floating diffusion node FD due to a charge transfer effect. Compared to a sensing circuit without the second thin film transistor T2 and whose equivalent capacitance $C_{FD}$ on the floating diffusion node FD includes the equivalent capacitance of the photodiode PD and the equivalent capacitance of the third thin film transistor T3, the equivalent capacitance $C_{FD}$ on the floating diffusion node FD of this embodiment may be reduced because it does not include the equivalent capacitance of the photodiode PD. Under the above configuration, the photoelectric conversion efficiency CG of the sensing circuit BC of this embodiment may be improved. The biometric sensing device 10 or the sensing circuit BC thereof may exhibit good sensitivity or electrical quality.

The following continues to describe the structure of the biometric sensing device 10 with reference to FIG. 1 and FIG. 3.

In an embodiment of the disclosure, the substrate 100 may be a rigid substrate or a flexible substrate. A material of the substrate 100 includes but not limited to glass, quartz, ceramic, sapphire, plastic, or other suitable materials. In another embodiment, the material of the substrate 100 may include a suitable opaque material. In some embodiments, when the substrate 100 is a flexible substrate, a suitable flexible material, including but not limited to polycarbonate (PC), polyimide (PI), polypropylene (PP), polyethylene terephthalate (PET), other suitable materials, or a combination of the foregoing, may be included. In addition, transmittance of the substrate 100 is not limited, that is, the substrate 100 may be a transparent substrate, a semi-transparent substrate, or a non-transparent substrate.

In some embodiments, the biometric sensing device 10 may selectively include a buffer layer 111 and a buffer layer 112. The buffer layer 111 and the buffer layer 112 are sequentially arranged on the substrate 100 in a normal direction of the substrate 100 (i.e., a Z axis). Materials of the buffer layer 111 and the buffer layer 112 include but not limited to silicon nitride, silicon oxide, or silicon oxynitride.

The biometric sensing device 10 includes a plurality of insulating material layers sequentially arranged on the substrate 100 on the Z axis. For instance, the biometric sensing device 10 includes an insulating layer 120, a gate insulating layer GI, an insulating layer 130, an insulating layer 140, an insulating layer 150, an insulating layer 160, an insulating layer 170, an insulating layer 181, an insulating layer 182, an insulating layer 183, and an insulating layer 190 sequentially stacked on the Z axis. The insulating layer 120, the gate insulating layer GI, the insulating layer 130, the insulating layer 140, the insulating layer 150, the insulating layer 160, the insulating layer 170, the insulating layer 181, the insulating layer 182, the insulating layer 183, and the insulating layer 190 may be single-layer structures or multilayer structures, and materials thereof are insulating materials, for example. The materials may include, for example, an organic material, an inorganic material, or a combination of the foregoing. The organic material may include but not limited to polyethylene terephthalate (PET), polyethylene (PE), polyethersulfone (PES), polycarbonate (PC), polymethylmethacrylate (PMMA), polyimide (PI), photo sensitive polyimide (PSPI), or a combination of the foregoing, and the inorganic material may include but not limited to silicon nitride, silicon oxide, silicon oxynitride, or a combination of the foregoing.

The sensing circuit BC is disposed in the multiple layers of the insulating layers. For instance, the first thin film transistor T1, the second thin film transistor T2, the third thin film transistor T3, and the fourth thin film transistor T4 are disposed on the buffer layer 112 and are covered by the insulating layer 120, the gate insulating layer GI, the insulating layer 130, the insulating layer 140, the insulating layer 150, and the insulating layer 160, but are not limited thereto. Each of the abovementioned thin film transistors includes a semiconductor layer, a gate (i.e., the control terminal), a source (i.e., the first terminal), and a drain (i.e., the second terminal). In some embodiments, the semiconductor layers of the thin film transistors may be formed by patterning a layer of semiconductor material. In some other embodiments, the semiconductor layer of each thin film transistor may be formed separately, but the embodiments of the disclosure are not limited thereto. The semiconductor layer may be doped with group V elements, such as arsenic (As), phosphorus (P), other group V elements, or a combination thereof to form an N-type doped region.

The semiconductor layer PS1 of the first thin film transistor T1, the semiconductor layer PS2 of the second thin film transistor T2, the semiconductor layer PS3 of the third thin film transistor T3, and the semiconductor layer PS4 of the fourth thin film transistor T4 are disposed on the buffer layer 112. The insulating layer 120 covers the semiconductor layer PS1, the semiconductor layer PS2, the semiconductor layer PS3, and the semiconductor layer PS4. The gate G1 of the first thin film transistor T1 overlaps the semiconductor layer PS1. The gate G2 of the second thin film transistor T2 overlaps the semiconductor layer PS2. The gate G3 of the third thin film transistor T3 overlaps the semiconductor layer PS3. The gate G4 of the fourth thin film transistor T4 overlaps the semiconductor layer PS4. The gate insulating layer GI is located between the gate G1 and the gate G2, the gate G3 and the gate G4, the semiconductor layer PS1 and the semiconductor layer PS2, and the semiconductor layer PS3 and the semiconductor layer PS4.

The insulating layer 130 and the insulating layer 140 are disposed on the gate G1, the gate G2, the gate G3, the gate G4, the semiconductor layer PS1, the semiconductor layer PS2, the semiconductor layer PS3, and the semiconductor layer PS4. The insulating layer 150 is disposed on the insulating layer 140.

A conductive layer M2 is disposed on the insulating layer 140. The conductive layer M2 may act as a non-gate electrode terminal, such as a source (i.e., the first terminal) or a drain (i.e., the second terminal), of a thin film transistor after being patterned, and is electrically connected to a semiconductor layer. The first terminal or the second terminal of the thin film transistor may contact the N-type doped region to be electrically connected to the semiconductor layer. For instance, the second terminal D2 (shown in FIG. 1) of the second thin film transistor T2 may contact a first doped region NP2. In addition, the third thin film transistor T3 may contact the first doped region NP2, but is not limited thereto.

In some embodiments, semiconductor layer PS2 of the second thin film transistor T2 further includes but not limited to a second doped region NM2 extending from a portion where the semiconductor layer PS2 overlaps the gate G2 to the left in FIG. 3. At least a portion of the second doped region NM2 extending from the semiconductor layer PS2 may overlap the photodiode PD, and description thereof is provided in following paragraphs. The second doped region NM2 may be doped as an N-type doped region. For instance, the first terminal S2 (shown in FIG. 1) of the second thin film transistor T2 may be the second doped region NM2. In some embodiments, a doping concentration in the first doped region NP2 is greater than a doping concentration in the second doped region NM2.

In this embodiment, the second doped region NM2 may overlap the photodiode PD on the Z axis. The structural relationship between the photodiode PD and the second doped region NM2 may be described in following paragraphs.

The insulating layer 150, the insulating layer 160, and the insulating layer 170 are disposed on the insulating layer and cover the sensing circuit BC (including the first thin film transistor T1, the second thin film transistor T2, the third thin film transistor T3, and the fourth thin film transistor T4). The insulating layer 120, the insulating layer 130, the insulating layer 140, the insulating layer 150, the insulating layer 160, and the insulating layer 170 may include an opening O1. The opening O1 penetrates the insulating layer 120, the insulating layer 130, the insulating layer 140, the insulating layer 150, the insulating layer 160, and the insulating layer 170, and the opening O1 overlaps the second doped region NM2.

A conductive layer M3 is disposed on the insulating layer 170 and may be used to reduce the impedance of the photodiode PD. For instance, the conductive layer M3 may partially overlap the first thin film transistor T1, the second thin film transistor T2, the third thin film transistor T3, and the fourth thin film transistor T4 on the Z, but is not limited thereto. A material of the conductive layer M3 may be similar to a material of the conductive layer M2, and description thereof is thus not repeated herein.

The photodiode PD is disposed on the insulating layer 170. The photodiode PD is, for example, a photodetector, and includes a first doped semiconductor material layer PN, a second doped semiconductor material layer PP, and an intrinsic semiconductor material layer PI located between the first doped semiconductor material layer PN and the second doped semiconductor material layer PP. The first doped semiconductor material layer PN and the second doped semiconductor material layer PP are of opposite doping types. For instance, the first doped semiconductor material layer PN may be but not limited to an N-type doping type, and the second doped semiconductor material layer PP may be but not limited to a P-type doping type. In some other embodiments, a material of the intrinsic semiconductor material layer PI includes, for example, amorphous silicon. The first doped semiconductor material layer PN may include amorphous silicon doped with group V elements such as phosphorus, arsenic, antimony, or bismuth. The second doped semiconductor material layer PP may include amorphous silicon doped with group III elements such as boron, aluminum, gallium, or indium.

In some embodiments, the first doped semiconductor material layer PN extends from the insulating layer 170 into the opening O1, extends to the insulating layer 170, and then contacts the conductive layer M3. The first doped semiconductor material layer PN contacts the second doped region NM2 of the semiconductor layer PS2 of the second thin film transistor T2 in the opening O1. Under the above configuration, the second doped region NM2 acts as a lower electrode of the photodiode PD. In this embodiment, the photodiode PD may be used to receive visible light and convert the visible light into an electrical signal. That is, the photodiode PD of this embodiment is, for example, a visible light sensor. Nevertheless, the disclosure is not limited thereto, and in other embodiments, the photodiode PD may also be used to detect light having other wavelength ranges.

A transparent electrode ITO1 is disposed on the second doped semiconductor material layer PP. The transparent electrode ITO1 acts as an upper electrode of the photodiode PD. A material of the transparent electrode ITO1 may be, but not limited to, indium tin oxide, indium zinc oxide, zinc aluminum oxide, indium aluminum oxide, indium oxide, gallium oxide, carbon nanotubes, nano silver particles, metal or an alloy with a thickness of less than 60 nanometers, an organic transparent conductive material, or other suitable transparent conductive materials.

The insulating layer 181, the insulating layer 182, and the insulating layer 183 are partially disposed on the transparent electrode ITO1. A transparent electrode ITO2 is disposed on the insulating layer 181, the insulating layer 182, and the insulating layer 183, and contacts the transparent electrode ITO1 that is not covered by the insulating layer 181, the insulating layer 182, and the insulating layer 183. A material of the transparent electrode ITO2 is similar to a material of the transparent electrode ITO1, and description thereof is thus not repeated herein.

The insulating layer 190 is disposed on the transparent electrode ITO2 to protect the transparent electrode ITO1 and the transparent electrode ITO2 from external water and oxygen, but is not limited thereto.

Note that a doping concentration of the first doped semiconductor material layer PN of the photodiode PD is less than the doping concentration of the second doped region NM2 of the semiconductor layer PS2 of the second thin film transistor T2, and the doping concentration of the second doped region NM2 is less than the doping concentration of the first doped region NP2. In other words, the doping concentration of the first doped region NP2 of the semiconductor layer PS2 is greater than the doping concentration of the second doped region NM2, and the doping concentration of the second doped region NM2 is greater than the doping concentration of the first doped semiconductor material layer PN. In this way, potential energy of the second doped region NM2 contacting the photodiode PD may be greater than potential energy of the first doped region NP2. A potential of the semiconductor layer PS2 of the second thin film transistor T2 overlapping the gate G2 may be greater than a potential of the second doped region NM2. During the sensed value readout period, after the gate G2 receives the driving signal Tx, the second thin film transistor T2 may be turned on, so the potential of the semiconductor layer PS2 overlapping the gate G2 is lowered. In this way, the current generated by the photodiode PD may flow from the region with high potential energy to the region with low potential energy. That is, the current flows from the first doped semiconductor material layer PN to the second doped region NM2 and then flows from the second doped region NM2 to the first doped region NP2, and the charge of the photodiode PD is transferred to the floating diffusion node FD (shown in FIG. 1) connected to the second thin film transistor T2 and the third thin film transistor T3. Therefore, the equivalent capacitance at the floating diffusion node FD may be reduced. Under the above configuration, photoelectric conversion efficiency CE of the biometric sensing device 10 and the sensing circuit BC thereof may be improved. The biometric sensing device 10 may exhibit good sensitivity or electrical quality.

Other embodiments are described for illustration in the following. It should be noted that the reference numerals and a part of the contents in the previous embodiments are used in the following embodiments, in which identical reference numerals indicate identical or similar components, and repeated description of the same technical content is omitted. Please refer to the description of the previous embodiments for the omitted content, which will not be repeated hereinafter.

Figure 4:
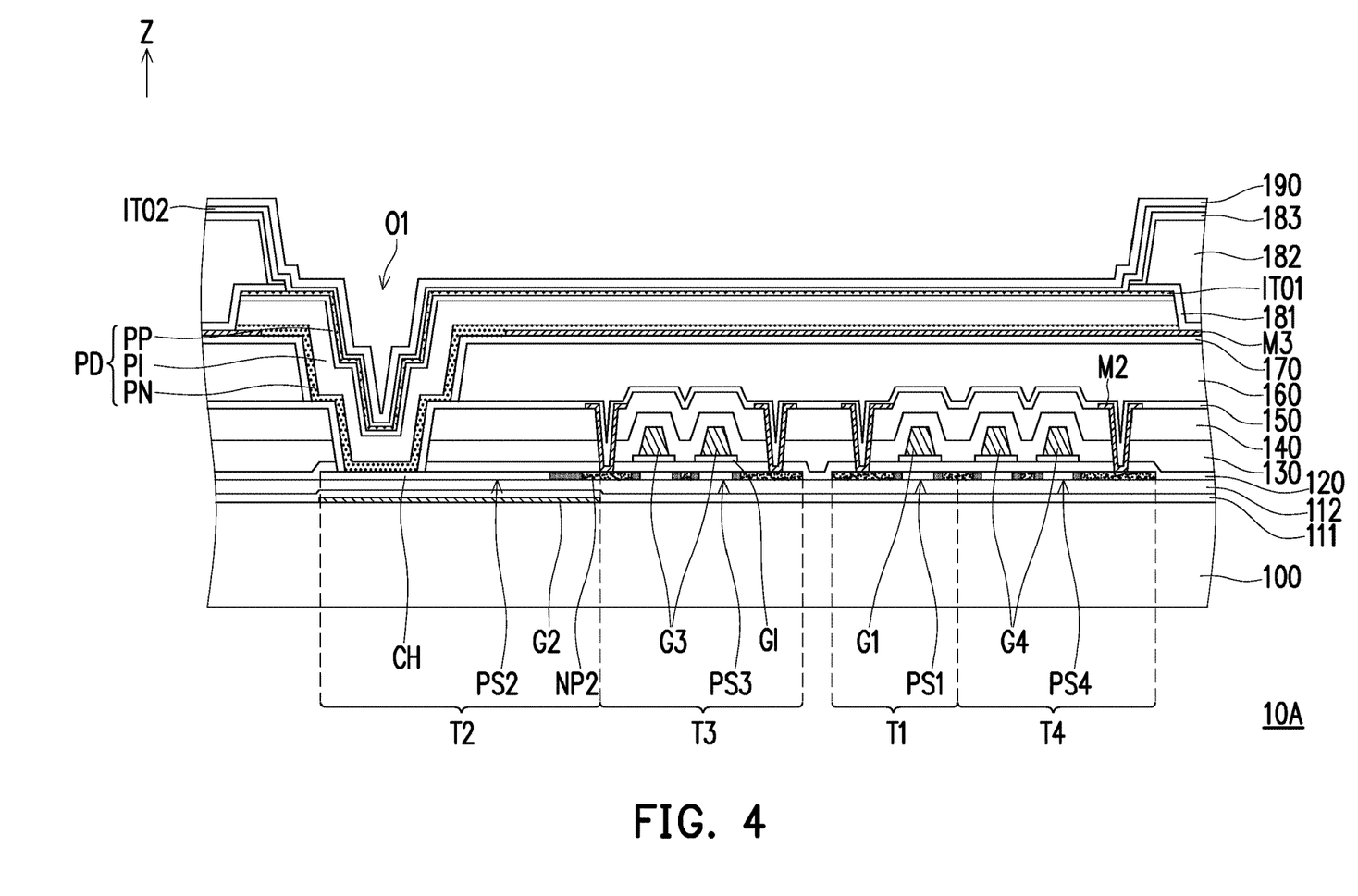
FIG. 4 is a schematic cross-sectional view of a biometric sensing device according to another embodiment of the disclosure.

FIG. 4 is a schematic cross-sectional view of a biometric sensing device according to another embodiment of the disclosure. For clarity of the accompanying drawings and convenience of description, several elements are omitted in FIG. 4. A biometric sensing device 10A of this embodiment is similar to the biometric sensing device 10 in FIG. 3, so that description of identical or similar components in the two embodiments is not repeated. The main difference between the biometric sensing device 10A of this embodiment and the biometric sensing device 10 is that the gate G2 of the second thin film transistor T2 is disposed on the substrate 100 and is covered by the buffer layer 111. For instance, the second thin film transistor T2 may be a bottom gate type transistor. For instance, one terminal of the gate G2 overlaps the first doped region NP2 of the semiconductor layer PS2, and another terminal of the gate G2 may completely overlap a portion of the semiconductor layer PS2 contacting the first doped semiconductor material layer PN, but is not limited thereto. In some embodiments, a portion of the gate G2 may overlap the opening O1 and the photodiode PD.

A channel region CH of the semiconductor layer PS2 may partially overlap the opening O1. The channel region CH may contact the photodiode PD located in the opening O1. To be specific, the first doped semiconductor material layer PN of the photodiode PD contacts the channel region CH of the semiconductor layer PS2 in the opening O1. In some embodiments, the channel region CH includes an undoped semiconductor material. Under the above configuration, potential energy of the channel region CH contacting the photodiode PD may be greater than the potential energy of the first doped region NP2. During the sensed value readout period, after the gate G2 receives the driving signal Tx, the second thin film transistor T2 may be turned on, so the potential of the semiconductor layer PS2 overlapping the gate G2 is lowered. In this way, the current generated by the photodiode PD may flow from the region with high potential energy to the region with low potential energy. That is, the current flows from the first doped semiconductor material layer PN to the channel region CH of the semiconductor layer PS2 and then flows from the channel region CH of the semiconductor layer PS2 to the first doped region NP2, and the charge of the photodiode PD is transferred to the floating diffusion node FD (shown in FIG. 1) connected to the second thin film transistor T2 and the third thin film transistor T3. Under the above configuration, the biometric sensing device 10A may obtain favorable technical effects similar to that provided in the foregoing embodiments.

Figure 5:
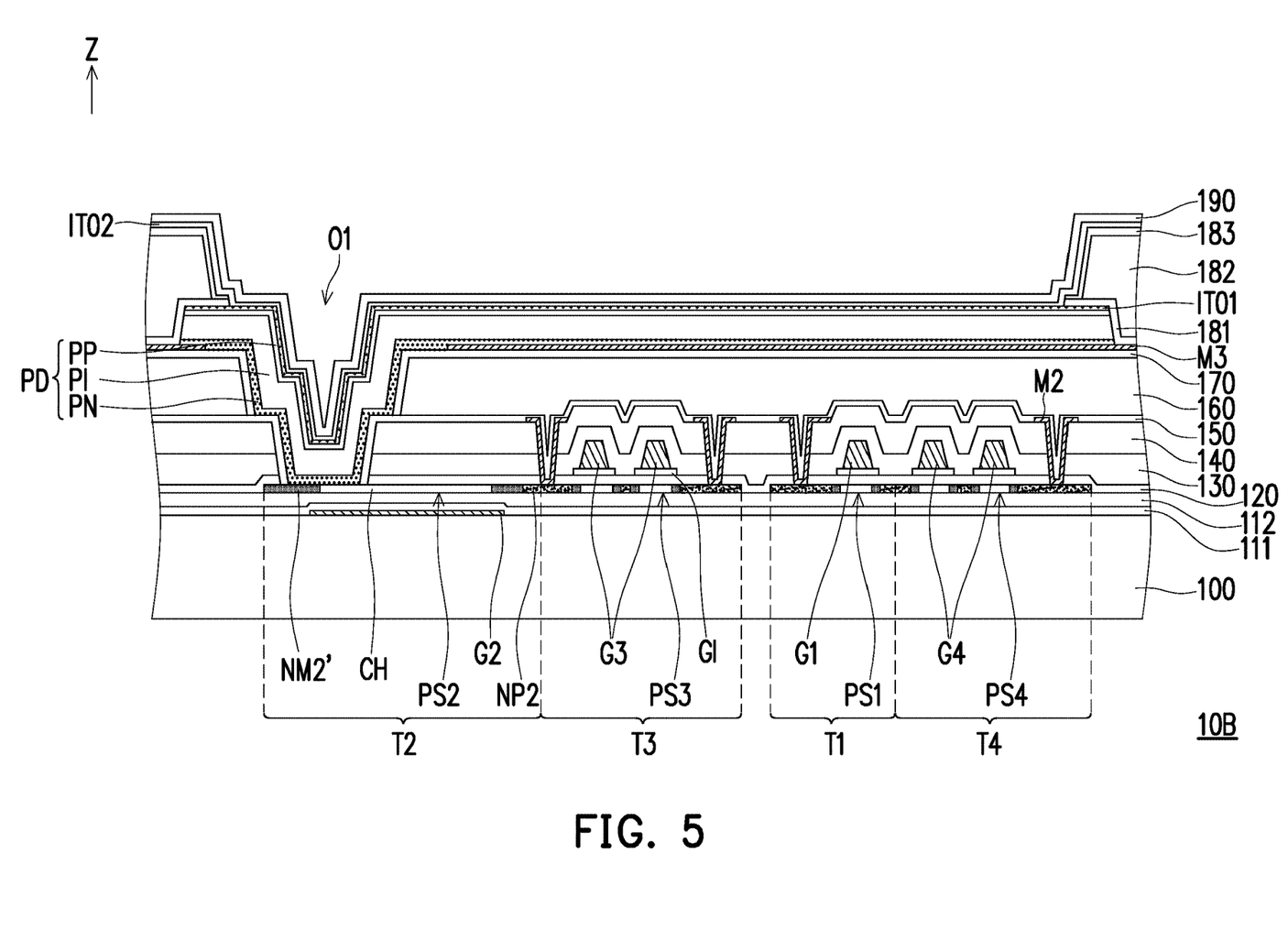
FIG. 5 is a schematic cross-sectional view of a biometric sensing device according to still another embodiment of the disclosure.

FIG. 5 is a schematic cross-sectional view of a biometric sensing device according to still another embodiment of the disclosure. For clarity of the accompanying drawings and convenience of description, several elements are omitted in FIG. 5. A biometric sensing device 10B of this embodiment is similar to the biometric sensing device 10A in FIG. 4, so that description of identical or similar components in the two embodiments is not repeated. The main difference between the biometric sensing device 10B of this embodiment and the biometric sensing device 10A is that the gate G2 of the second thin film transistor T2 partially overlaps the portion of the semiconductor layer PS2 contacting the first doped semiconductor material layer PN. A cut-off terminal of the semiconductor layer PS2 to the aforementioned contact portion may be doped at approximately a center of the opening O1 to form a second doped region NM2'. In other words, the second doped region NM2' is located in part of the opening O1 and contacts a portion of the first doped semiconductor material layer PN in the opening O1.

Part of the gate G2 overlaps the channel region CH, and part of the gate G2 overlaps the second doped region NM2'. Under the above configuration, the first doped semiconductor material layer PN may contact part of the second doped region NM2'. Since a resistance value of the second doped region NM2' may be lower than that of the undoped semiconductor layer PS2, a moving speed of electrons may be increased, and the electrical quality of the second thin film transistor T2 or the biometric sensing device 10B may be further improved. In addition, the potential energy of the channel region CH of the semiconductor layer PS2 contacting the photodiode PD may be greater than the potential energy of the first doped region NP2. During the sensed value readout period, after the gate G2 receives the driving signal Tx, the second thin film transistor T2 may be turned on, so the potential of the semiconductor layer PS2 overlapping the gate G2 is lowered. In this way, the current generated by the photodiode PD may flow from the region with high potential energy to the region with low potential energy. That is, the current flows from the first doped semiconductor material layer PN to the channel region CH of the semiconductor layer PS2 and the second doped region NM2' and then flows from the channel region CH of the semiconductor layer PS2 to the first doped region NP2, and the charge of the photodiode PD is transferred to the floating diffusion node FD (shown in FIG. 1) connected to the second thin film transistor T2 and the third thin film transistor T3. Under the above configuration, the biometric sensing device 10B may obtain favorable technical effects similar to that provided in the foregoing embodiments.

Figure 6:
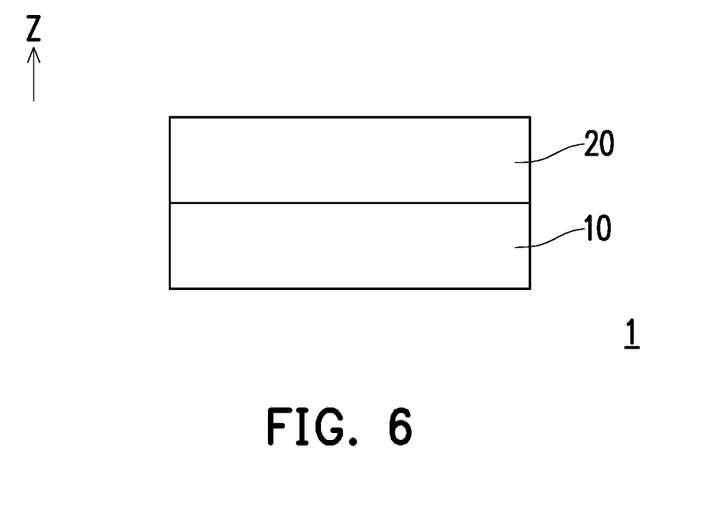
FIG. 6 is a cross-sectional schematic view of an electronic apparatus according to an embodiment of the disclosure.

FIG. 6 is a cross-sectional schematic view of an electronic apparatus according to an embodiment of the disclosure. For clarity of the accompanying drawings and convenience of description, several elements are omitted in FIG. 6. A display apparatus 1 shown in FIG. 6 includes a display panel 20 and the biometric sensing device 10 as shown in FIG. 3, but is not limited thereto. In other embodiments, the biometric sensing device shown in FIG. 6 may also be the biometric sensing device 10A shown in FIG. 4 or the biometric sensing device 10B shown in FIG. 5, depending on the needs of the designer. The biometric sensing device 10 is disposed below the display panel 20. In some embodiments, the display panel 20 may be, but not limited to, any type of display panel, such as a flat display panel, a curved display panel, a flexible display panel, a spliced display panel, or a transparent display panel. The display panel may include but not limited to a liquid crystal display panel, a LED display panel, a QD display panel, a fluorescent display panel, or a phosphorescent display panel. The light emitting diode display panel may include, but not limited to, an OLED, a millimeter/sub-millimeter LED, a micro LED, or a QD LED. Under the above configuration, the display apparatus 1 to which the biometric sensing device 10 is applied may be, but not limited to, an in-display optical fingerprint recognition display apparatus. Besides, the display apparatus 1 may obtain favorable technical effects similar to that provided in the foregoing embodiments.

In view of the foregoing, in the biometric sensing device and the display apparatus including the same provided by an embodiment of the disclosure, since the sensing circuit may control the second thin film transistor through the driving signal, during the sensed value readout period, the second thin film transistor is turned on, and that the charge stored in the photodiode is selectively transferred onto the floating diffusion node due to the charge transfer effect. In this way, since third thin film transistor has cleared the charge stored on the floating diffusion node, so the charge on the floating diffusion node is essentially the charge transferred from the photodiode. The equivalent capacitance on the floating diffusion node may be reduced. Therefore, the photoelectric conversion efficiency of the biometric sensing device and the sensing circuit thereof may be improved. The biometric sensing device may exhibit good sensitivity or electrical quality.

Besides, the doping concentration of the first doped region of the semiconductor layer is greater than the doping concentration of the second doped region, and the doping concentration of the second doped region is greater than the doping concentration of the first doped semiconductor material layer. Therefore, the potential energy of the second doped region contacting the photodiode may be greater than the potential energy of the first doped region. During the sensed value readout period, the current generated by the photodiode may be controlled by the second thin film transistor to flow from the high-potential second doped region to the low-potential first doped region to transfer the charge of the photodiode to the floating diffusion node. Therefore, the equivalent capacitance at the floating diffusion node may be reduced. The photoelectric conversion efficiency of the biometric sensing device and the display apparatus including the same may be improved. The biometric sensing device or the display apparatus may exhibit good sensitivity or electrical quality.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:

1. A biometric sensing device, comprising:
a first thin film transistor, having a gate;
a second thin film transistor, having a semiconductor layer and a non-gate electrode terminal, wherein the non-gate electrode terminal is electrically connected to the gate of the first thin film transistor; and
a photodiode, contacting the semiconductor layer, wherein the photodiode comprises a doped semiconductor material layer contacting the semiconductor layer and a doping concentration of a portion of the semiconductor layer contacting the doped semiconductor material layer is greater than a doping concentration of the doped semiconductor material layer.

2. The biometric sensing device according to claim 1, wherein a gate of the second thin film transistor overlaps a portion of the semiconductor layer contacting the doped semiconductor material layer.

3. The biometric sensing device according to claim 1, wherein a gate of the second thin film transistor partially overlaps a portion of the semiconductor layer contacting the doped semiconductor material layer.

4. The biometric sensing device according to claim 1, further comprising a third thin film transistor, wherein the third thin film transistor has a non-gate electrode terminal electrically connected to the gate of the first thin film transistor.

5. The biometric sensing device according to claim 4, wherein the non-gate electrode terminal of the third thin film transistor, the gate of the first thin film transistor, and the non-gate electrode terminal of the second thin film transistor are connected to a terminal floating diffusion node, and the second thin film transistor is connected between the terminal floating diffusion node and the photodiode.

6. The biometric sensing device according to claim 1, further comprising a fourth thin film transistor, wherein the fourth thin film transistor has a non-gate electrode terminal electrically connected to a non-gate electrode terminal of the first thin film transistor.

7. The biometric sensing device according to claim 1, wherein the biometric sensing device is a fingerprint sensing device.

8. The biometric sensing device according to claim 1, wherein a non-gate electrode terminal of the first thin film transistor is coupled to a first voltage source.

9. A display apparatus, comprising:
a display panel; and
the biometric sensing device according to claim 1, wherein the biometric sensing device is disposed below the display panel.

10. The display apparatus according to claim 9, wherein the non-gate electrode terminal of the second thin film transistor comprises a first terminal or a second terminal, the first terminal is electrically connected to the photodiode, and the second terminal is electrically connected to the gate of the first thin film transistor.

11. The display apparatus according to claim 9, wherein a gate of the second thin film transistor overlaps a portion of the semiconductor layer contacting the doped semiconductor material layer.

12. The display apparatus according to claim 9, wherein a gate of the second thin film transistor partially overlaps a portion of the semiconductor layer contacting the doped semiconductor material layer.

13. The display apparatus according to claim 9, further comprising a third thin film transistor, wherein the third thin film transistor has a non-gate electrode terminal electrically connected to the gate of the first thin film transistor.

14. The display apparatus according to claim 9, further comprising a fourth thin film transistor, wherein the fourth thin film transistor has a non-gate electrode terminal electrically connected to a non-gate electrode terminal of the first thin film transistor.

15. The display apparatus according to claim 9, wherein the biometric sensing device is a fingerprint sensing device.

16. The display apparatus according to claim 9, wherein a non-gate electrode terminal of the first thin film transistor is coupled to a first voltage source.

* * * * *